United States Patent
Kim

[19]

[11] Patent Number: 5,925,935
[45] Date of Patent: Jul. 20, 1999

[54] SEMICONDUCTOR CHIP WITH SHAPED BONDING PADS

[75] Inventor: Sang Jun Kim, Asan, Rep. of Korea

[73] Assignee: Samsung Electronics Co., Ltd., Suwon, Rep. of Korea

[21] Appl. No.: 08/941,063

[22] Filed: Sep. 30, 1997

[30] Foreign Application Priority Data

Oct. 1, 1996 [KR] Rep. of Korea ...................... 96-43509

[51] Int. Cl.⁶ ............................................... H01L 23/492
[52] U.S. Cl. ........................... 257/786; 257/773; 257/784
[58] Field of Search ..................................... 257/786, 773, 257/784

[56] References Cited

U.S. PATENT DOCUMENTS

| | | | |
|---|---|---|---|
| 5,300,815 | 4/1994 | Rostoker ................................. | 257/786 |
| 5,444,303 | 8/1995 | Greenwood et al. .................... | 257/786 |
| 5,569,964 | 10/1996 | Ikebe ...................................... | 257/786 |
| 5,796,171 | 8/1998 | Koc et al. ............................... | 257/786 |

FOREIGN PATENT DOCUMENTS

| | | | |
|---|---|---|---|
| 60-101938 | 6/1985 | Japan ..................................... | 257/786 |
| 1-107549 | 4/1989 | Japan ..................................... | 257/786 |
| 1-298731 | 12/1989 | Japan ..................................... | 257/786 |
| 2-251146 | 10/1990 | Japan ..................................... | 257/786 |
| 4-056358 | 2/1992 | Japan ..................................... | 257/786 |
| 4881186 | 6/1992 | Japan ..................................... | 257/786 |
| 5-235090 | 9/1993 | Japan ..................................... | 257/786 |

OTHER PUBLICATIONS

Horner, Rita N. et al., "Implementation of Pad Circuitry for Radially Staggered Bond Pad Arrangements" Hwelett–Packard Journal, Dec. 1996, pp. 51–54.

"Unique Pad Geometry for Optimum Solder Application" IBM Technical Disclosure Bulletin, vol. 34, No. 1, Jun. 1991, pp. 465–466.

Primary Examiner—David B. Hardy
Attorney, Agent, or Firm—Jones, Volentine, Steinberg & Whitt, L.L.P.

[57] ABSTRACT

A semiconductor chip comprises a plurality of bonding pads formed in a row along an edge of the chip and spaced at a designated gap pitch between confronting sides of adjacent pads. Each of the pads has a length perpendicular to the edge of the chip, a length distance, a width parallel to the edge of the chip, and a width distance. The length distance is different than the width distance.

11 Claims, 16 Drawing Sheets

SEMICONDUCTOR CHIP WITH SHAPED BONDING PADS

BACKGROUND OF THE INVENTION

1. Field of the Invention

The present invention generally relates to semiconductor chips, and more particularly to semiconductor chips having a plurality of bonding pads on one surface, whose length, width and shape are modified in order to accomplish more precise interconnections with bonding wires and to achieve greater reliability for electronic components containing the chips.

2. Description of The Related Art

Semiconductor devices are progressing toward higher mounting density, higher capacity, and greater miniaturization of each semiconductor chip, in order to meet pressing demands for smaller, multifunctional electronic components. As more functionality has been built into each chip, the number of the bonding pads has increased which increases the size of the chip, resulting in an increase in the manufacturing cost of each semiconductor chip. Costs can be reduced if more bonding pads can be fit per unit length of the semiconductor chip's edge.

There is a limit to decreasing the pitch of bonding pads, i.e. the spacing between neighboring bonding pads. When the bonding pads have a pitch that is too fine, the accuracy of bonding between the bonding pads and corresponding inner leads is reduced, and electrical defects can occur. Electrical defects include shorts between adjacent bumps of bonding material that connect one inner lead wire to one bonding pad. Electrical defects also include insufficient shear strength of a bump due to insufficient contact area between the bump and the bonding pad. Insufficient shear strength leads to increased chances that the connection between a lead wire and a bonding pad will be broken.

Several terms used throughout the specification are defined herein. The term "bump" refers to the bump or small ball of bonding material that electrically connect a bonding wire to an upper surface of a corresponding bonding pad. The term "bump shear strength" refers to the shearing force on the bump necessary to separate the bump from the bonding pad. "Bump shear gram" defines the weight of the small ball having a specific "bump shear strength".

The distance between confronting sides of adjacent pads is called the "gap pitch," and the distance between corresponding parts of adjacent pads is called a "total pitch." The unit of distance marking the dimensions of the components in the specification and drawings is $\mu$m, unless otherwise indicated.

Furthermore, each bonding pad has four sides. An outer side is closest to the edge of the chip, and an inner side is farthest from the edge of the chip. Each pad has one or two confronting sides facing another pad in the row of pads. End pads have only one confronting side, and interior pads have two confronting sides. The fourth side of each end pad is unnamed.

For example, a semiconductor chip may be specified as follows:

1) The position of the bonding pads: rows on all four edges of the chip
2) The number of the bonding pads: 208 pads (52 per edge * 4 edges)
3) The total pitch along each edge: 70 $\mu$m FIG. 1 is a plan view depicting a conventional semiconductor chip and FIG. 2 is a enlarged plan view of the part 'A' in FIG. 1. FIG. 3 is a cross-sectional view taken along the line 3—3 of FIG. 2.

Referring to FIG. 1, FIG. 2, and FIG. 3, bonding pad rows, each comprising a plurality of bonding pads 12 having a square shape, are formed on the four edges of an upper surface of a semiconductor chip 10. The bonding pads 14, which are formed on both ends of the row of the bonding pads 12, are referred to as "end bonding pads". The gap pitch of the pads 12, 14 in a row is 6 $\mu$m. Passivation layers 16 are formed on upper surfaces of the bonding pads 12 and the end bonding pads 14 so as to expose the central parts of the pads 12A, 14A. The distance along each side of the pads 12, 14 is 64 $\mu$m, while the distance across the exposed part of the pads 12A, 14A is 54 $\mu$m. An oxidation layer ($SiO_2$) 18 is interposed on the pads 12, 14 under the passivation layer 16 to prevent stress generated by the hardening of the passivation layer.

FIG. 4 is a perspective view depicting the electrical connections between the conventional semiconductor chip 10 of FIG. 1 and a lead frame. FIG. 5 is an enlarged plan view of the part 'B' in FIG. 4 showing the bump 42 electrically connecting the lead wire 40 to the bonding pad 12, 14. FIG. 6 is a schematic view depicting the dimensions of the bump 42 and the bonding pad 12, 14.

Referring to FIG. 4 and FIG. 5 a lower surface of the semiconductor chip 10 is attached to an upper surface of the die pad 20 of the lead frame, and the bonding pads 12, 14 formed on the upper surface of the semiconductor chip 10 are electrically connected to corresponding leads 30 of the lead frame by electrical connection means such as bonding wires 40. The connection between the wire 40 and the bonding pad 12, 14 is effected by a small bump 42.

In FIG. 6, the exposed bonding pads 12A and the exposed end bonding pads 14A have the same area given by 54 $\mu$m * 54 $\mu$m. The minimum diameter of the respective bump 42 indicated by an internal dotted line circle is 44 $\mu$m, and the maximum diameter of the respective bump 42 indicated by a larger solid line circle is 54 $\mu$m. In other words, the diameter and tolerance of the bump 42 is 49±5 $\mu$m. The minimum diameter is required to produce a bond with enough bump shear strength to reliably keep contact with the bonding pad 12, 14. The maximum diameter is required to inhibit adjacent bumps from spilling over the passivation layer, possibly contacting each other, and causing electrical shorts.

Consequently, the distance between two neighboring bumps 42, which are bonded to the upper surface of a corresponding one of two bonding pads 12, or the bonding pad 12 and the end bonding pad 14, is 6 $\mu$m at the minimum, even if each bump 42 is displaced from the center by up to 5 $\mu$m. This inhibits electrical shorts. When the bumps 42 are formed farther offset from the center of the bonding pads 12, 14 so that the bump is partly on the semiconductor chip 10 the bump shear strength may become insufficient. For example, when 25% or more of the area of the bump 42 deviates from the bonding pads 12 or the end bonding pads 14 the bump shear strength is insufficient.

In other words, when the bumps 42 of the semiconductor chip 10 are not exactly aligned with the corresponding upper surfaces of the interior bonding pads 12 or the end bonding pads 14, but partly deviate from the interior bonding pads 12 or the end bonding pads 14, electrical shorts or insufficient bump shear strengths occur.

Because it is difficult to exactly control the bump position due to limitations of the bonding wire equipment, the described defects do occur in the conventional semiconductor and can be expected to occur more frequently as the gap pitch and bonding pads are made smaller to accommodate an increased bonding pad density.

SUMMARY OF THE INVENTION

Accordingly, an object of the present invention is to provide a semiconductor chip with a greater reliability by modifying the length, width and shape of the bonding pads on the semiconductor chip.

The foregoing object can be achieved by a semiconductor chip comprising a plurality of bonding pads formed in a row along an edge of the chip and spaced at a designated gap pitch between confronting sides of adjacent pads. Each of the pads has a length perpendicular to the edge of the chip and a length distance, and each of the pads has a width parallel to the edge of the chip and a width distance. The length distance is different than the width distance.

In another aspect of the invention an end pad disposed at the end of each row has an end width distance that is greater than the length distance, while interior pads have interior width distances each less than the length distance.

In other aspects of the invention, the end width is variable and the interior widths are variable.

BRIEF DESCRIPTION OF THE DRAWINGS

These and various other features and advantages of the present invention will be described with reference the accompanying drawings, wherein like reference numerals designate like structural elements, and, in which.

DETAILED DESCRIPTION OF THE INVENTION

The invention is directed to a semiconductor chip with shaped pads that provides for greater reliability in the contacts between leads and bonding pads. The invention can be used to reduce the size and pitch of chips with many bonding pads.

Figure 1:
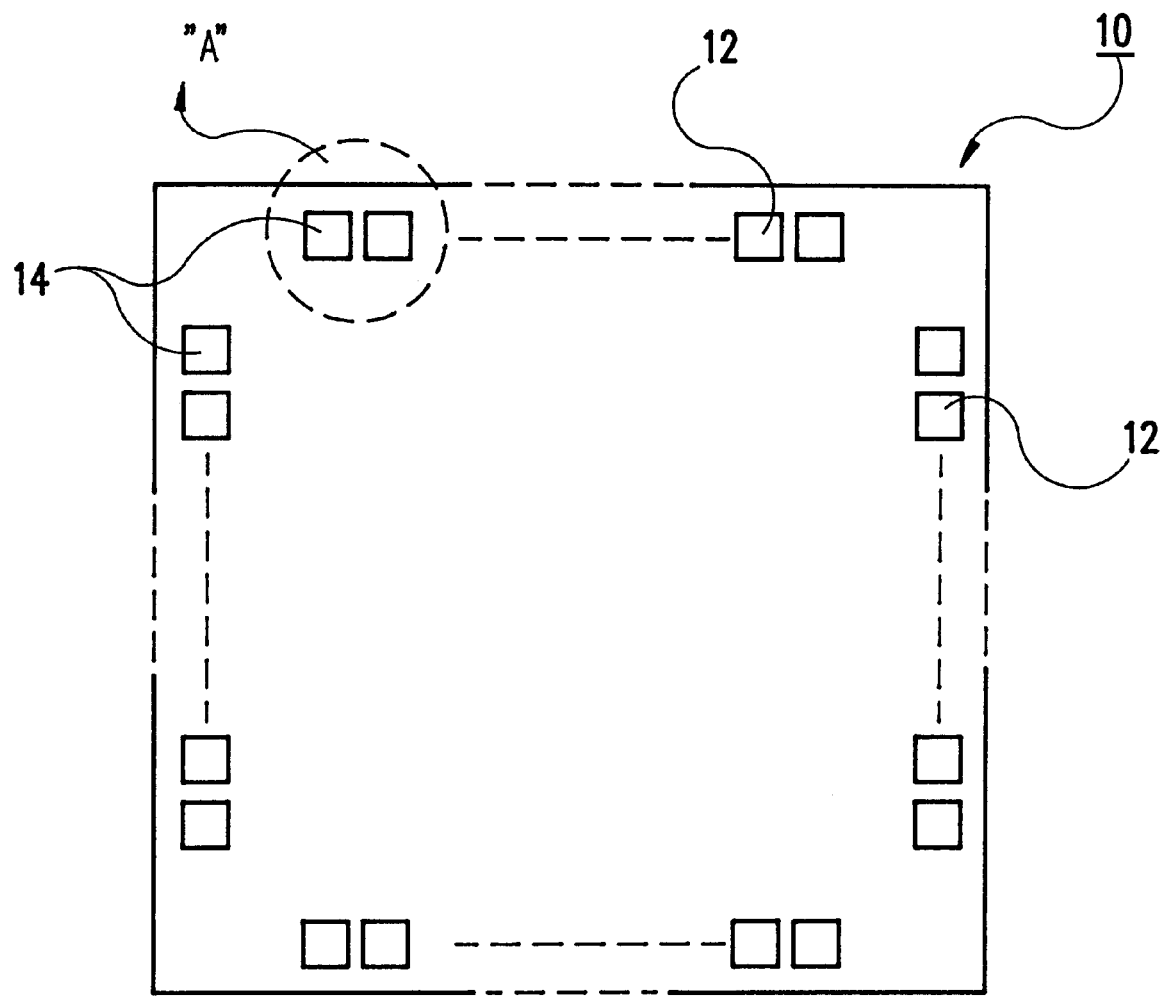
FIG. 1 is a plan view depicting a conventional semiconductor chip.
Figure 2:
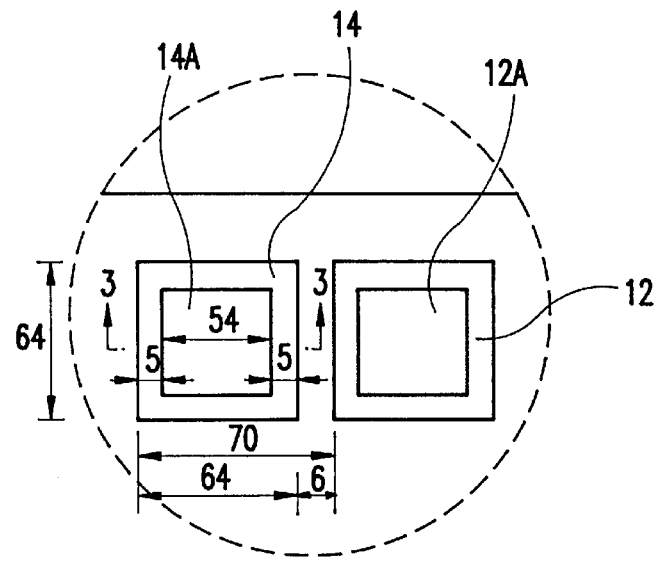
FIG. 2 is an enlarged plan view of the part 'A' in FIG. 1.
Figure 3:
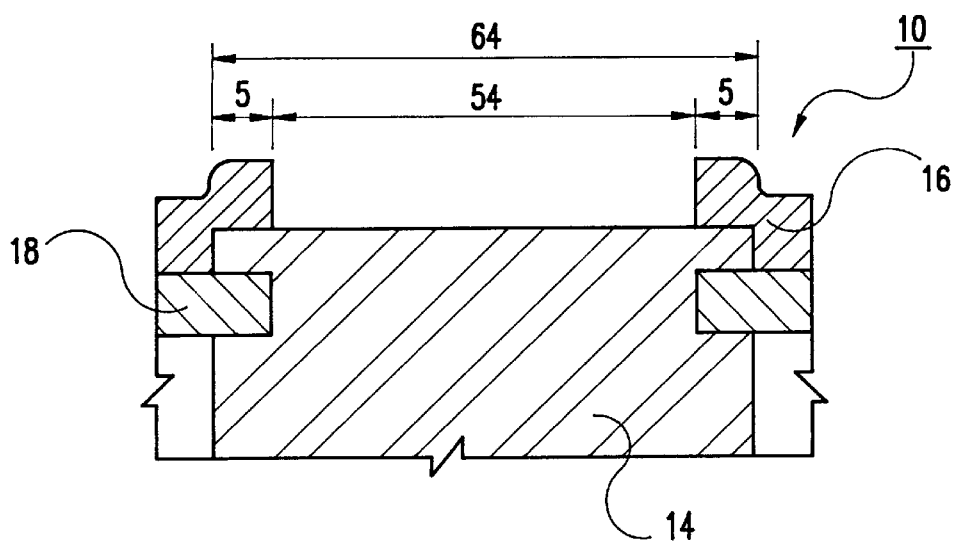
FIG. 3 is a cross sectional view taken along the line 3—3 of FIG. 2.
Figure 4:
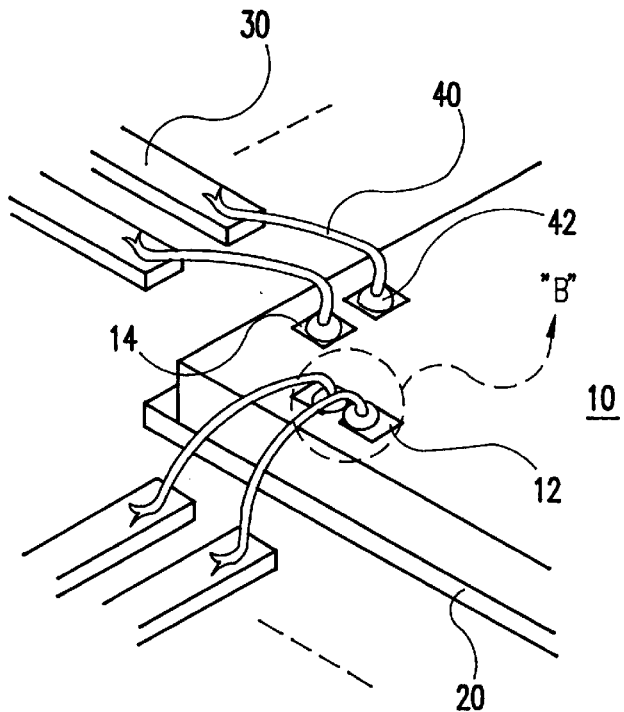
FIG.4 is a perspective view depicting the electrical connections between the conventional semiconductor chip of FIG. 1 and a lead frame.
Figure 5:
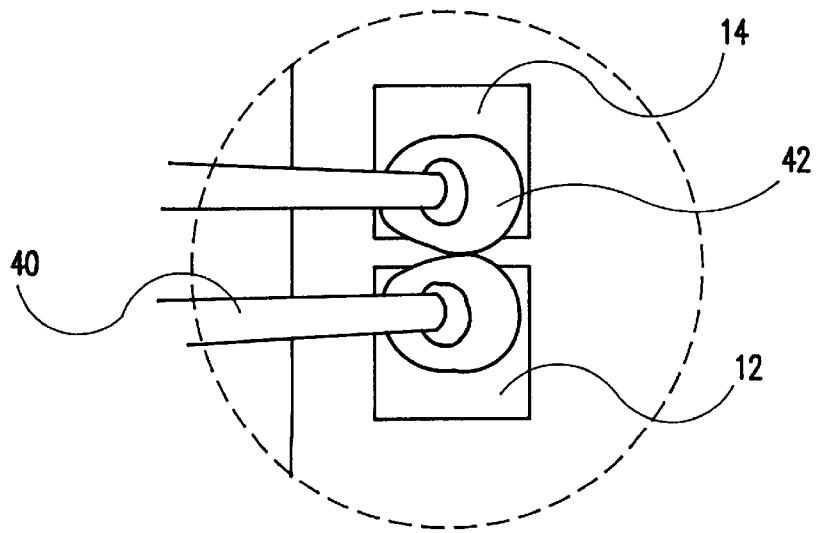
FIG. 5 is an enlarged plan view of the part 'B' in FIG. 4.
Figure 6:
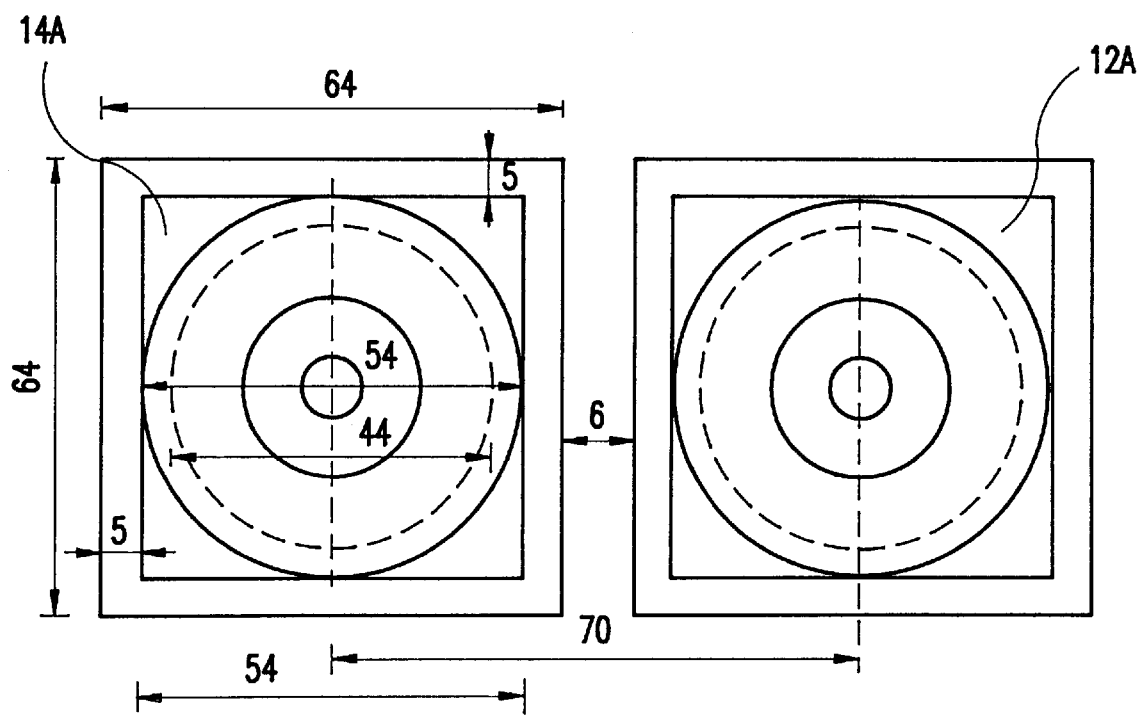
FIG. 6 is a schematic view depicting the dimension of the bump electrically connected to the upper surface of the bonding pad.
Figure 7:
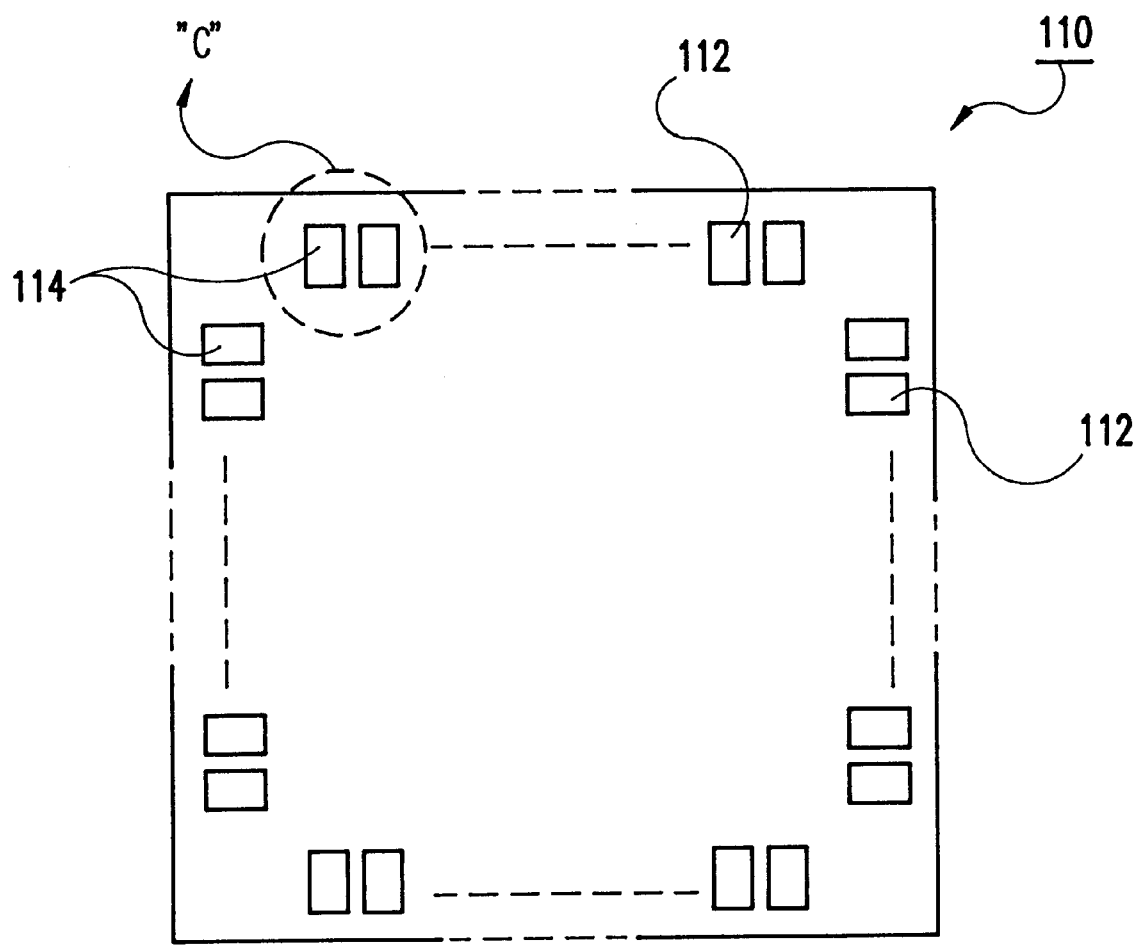
FIG. 7 is a plan view depicting the semiconductor chip according to a first embodiment of the present invention.
Figure 8:
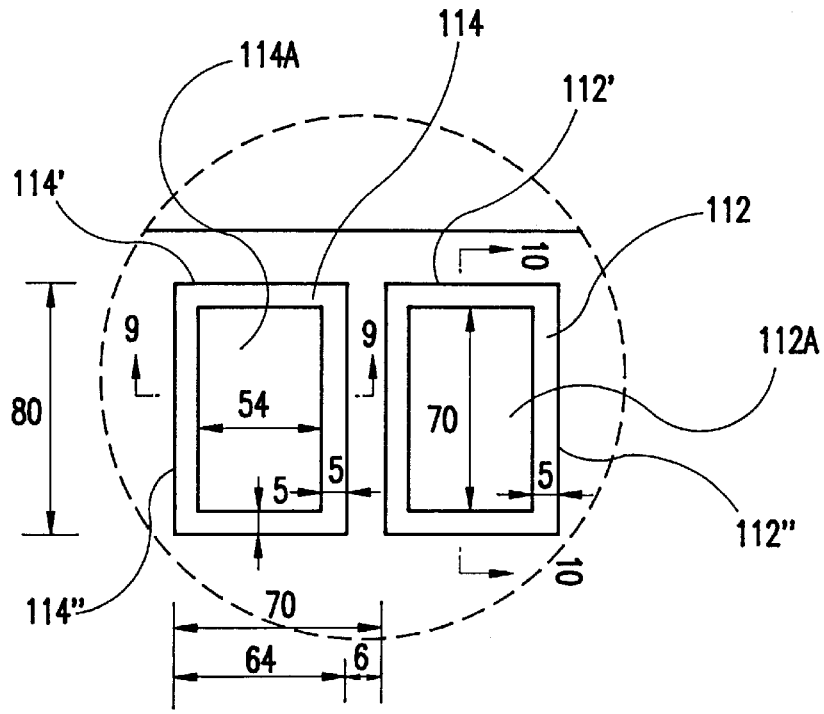
FIG. 8 is an enlarged plan view of the part 'C' in FIG. 7.
Figure 9:
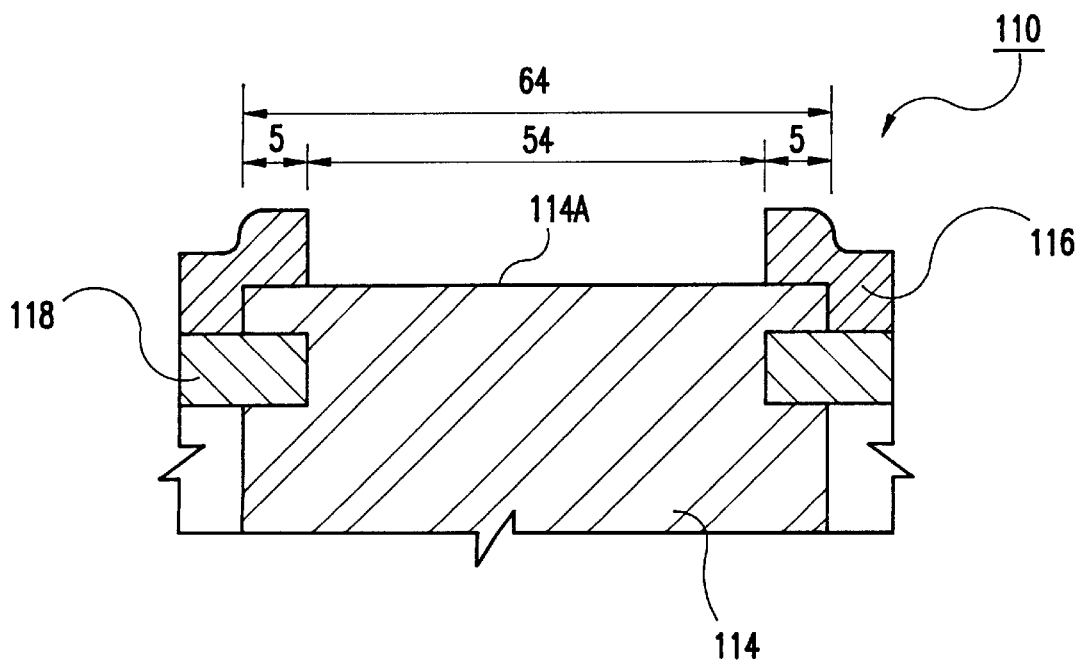
FIG. 9 is a cross sectional view taken along the line 9—9 of FIG. 8.
Figure 10:
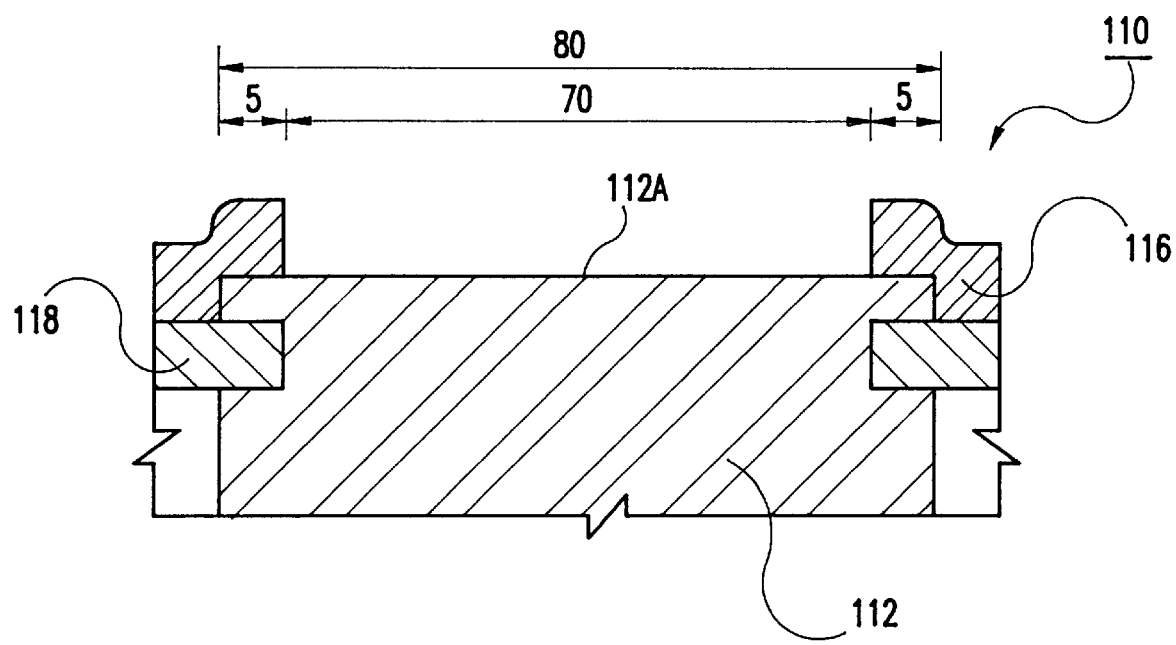
FIG. 10 is a cross sectional view taken along the line 10—10 of FIG. 8.

The first embodiment is described referring to FIG. 7, FIG. 8, FIG. 9, FIG. 10, FIG. 11 and FIG. 12. FIG. 7 is a plan view depicting the semiconductor chip according to a first embodiment of the present invention and FIG. 8 is an enlarged plan view of the part 'C' in FIG. 7. FIG. 9 and FIG. 10 are cross-sectional views taken along the line 9—9 and the line 10—10 of FIG. 8, respectively.

In the first embodiment, bonding pad rows, each comprising a plurality of bonding pads 112, 114 having a non-square rectangular shape, are formed on the four edges of an upper surface of a semiconductor chip 110. End bonding pads 114 are formed on both ends of the row and interior bonding pads 112 are disposed between the end pads. In this example, the gap pitch between the pads 112, 114 in a row is 6 µm.

Unlike the square conventional semiconductor chip 10, the semiconductor chip 110 according to the present invention has lengths 112", 114" perpendicular to the edge of the chip with distances that are greater than the distances of the widths 112', 114' parallel to the edge of the chip. For example, in the specific embodiment shown in FIG. 8, the pads 112, 114 have a length distance of 80 µm and a width distance of 64 µm for a total area of 64 µm * 80 µm.

Because passivation layers 116 are formed on the upper surfaces of the interior bonding pads 112 and the end bonding pads 114 so as to cover a border area and expose a central part of the pads 112, 114, the area of the exposed bonding pads, both interior 112A and end 114A, is 54 µm * 70 µm. An oxidation layer ($SiO_2$) 118 is interposed between the pads 112, 114 under the passivation layer 116 to prevent stress generated by the hardening of the passivation layer.

Figure 11:
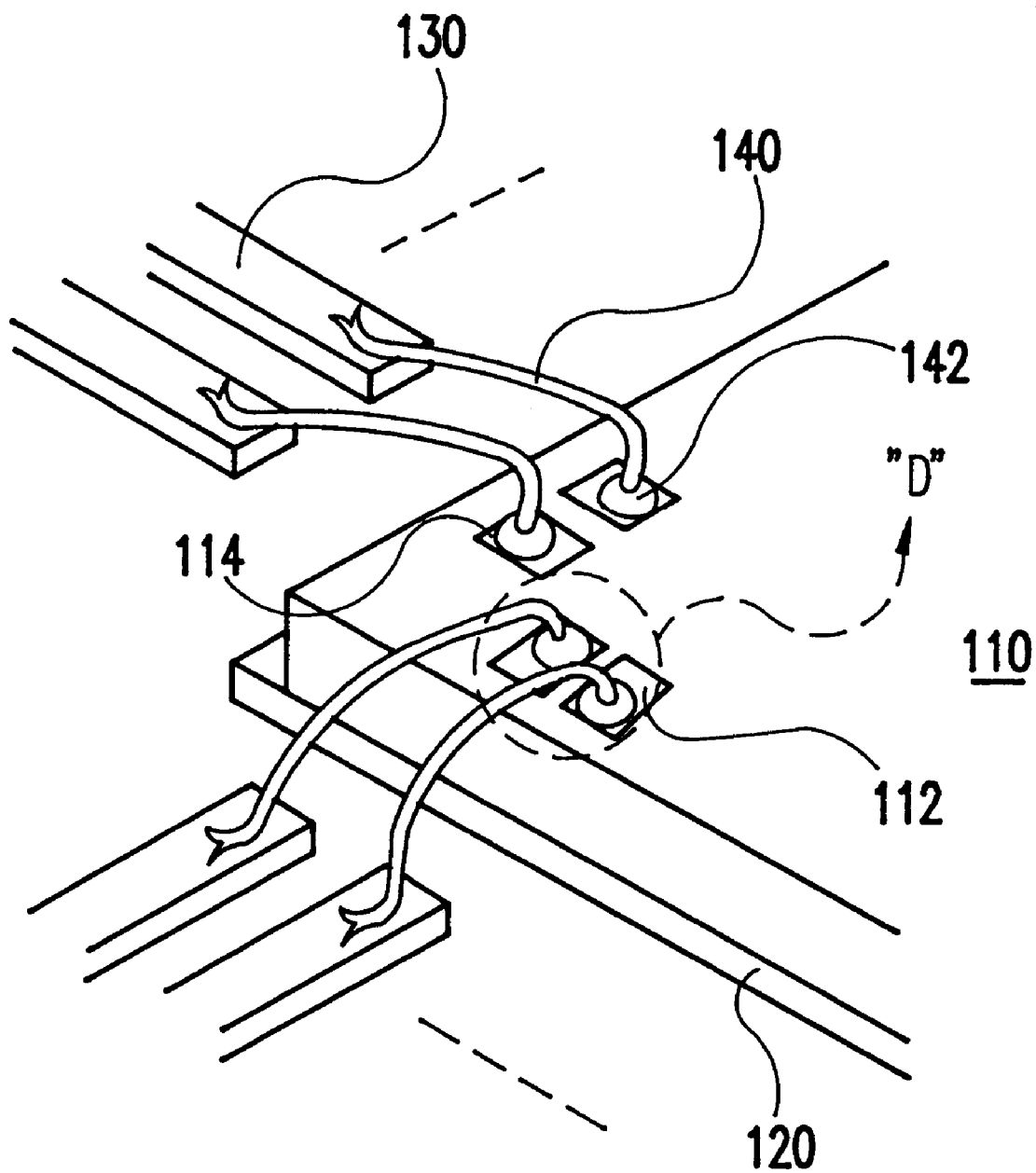
FIG. 11 is a perspective view depicting the electrical connections between the semiconductor chip of FIG. 7 and a lead frame.
Figure 12:
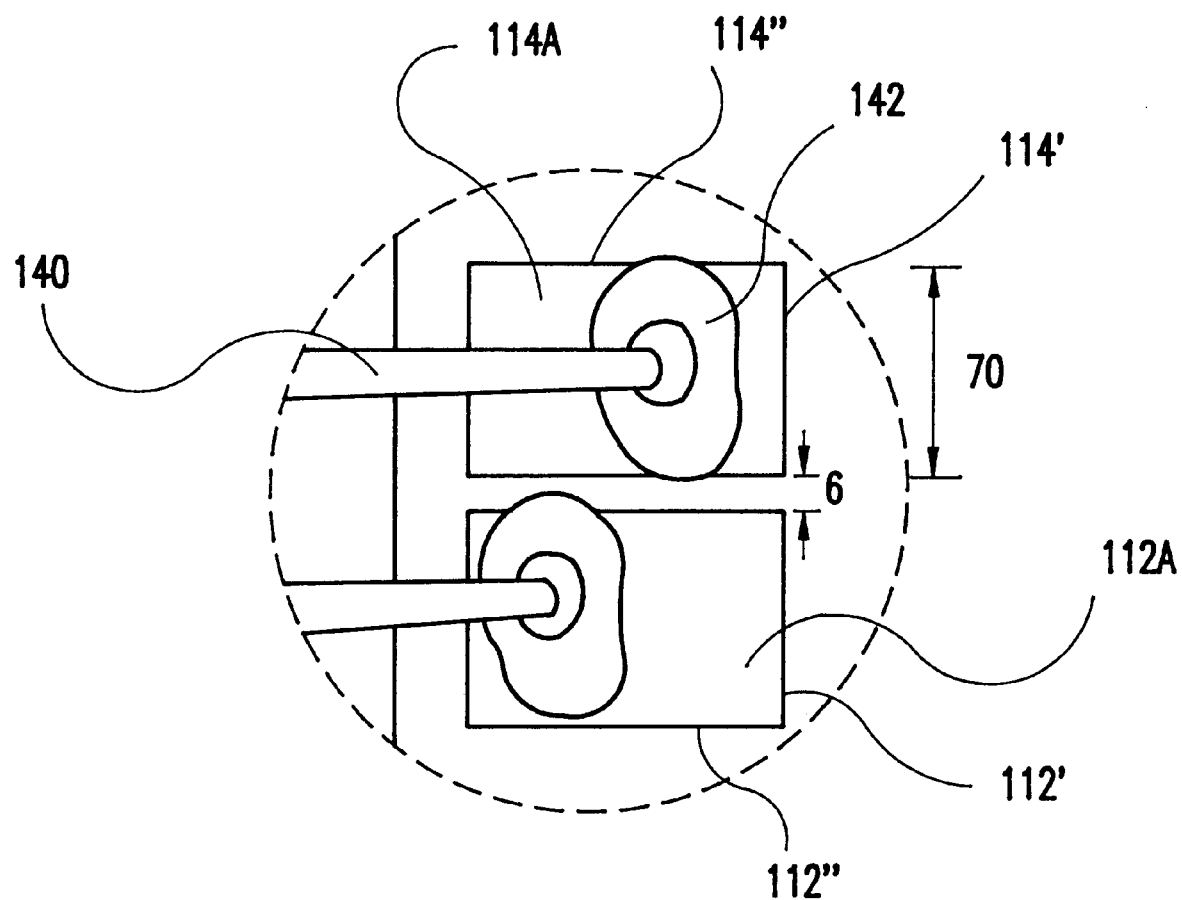
FIG. 12 is an enlarged plan view of the part 'D' in FIG. 11.

FIG. 11 is a perspective view depicting the electrical connections between the semiconductor chip of FIG. 7 and a lead frame. FIG. 12 is an enlarged plan view of the part 'D' in FIG. 11.

Referring to FIG. 11 and FIG. 12, the interior bonding pads 112 or the end bonding pads 114 are electrically connected to respective leads 130 in such a manner that the bumps 142 formed on the rows of the pads 112, 114 are zig-zagged, i.e. alternately placed closer to the outer side of each pad and closer to the inner side of each pad. As can be seen from FIG. 12, since the bumps 142 are formed in a zigzagged manner the distance between two neighboring bumps 142 becomes greater. Therefore, even when bumps are placed off center from the pads, electrical defects such as bump shorts can be significantly decreased, compared to the conventional semiconductor chip 10. Also, the bump size, and correspondingly, the bump shear strength, can be greater without contacting the neighboring bump.

Figure 13:
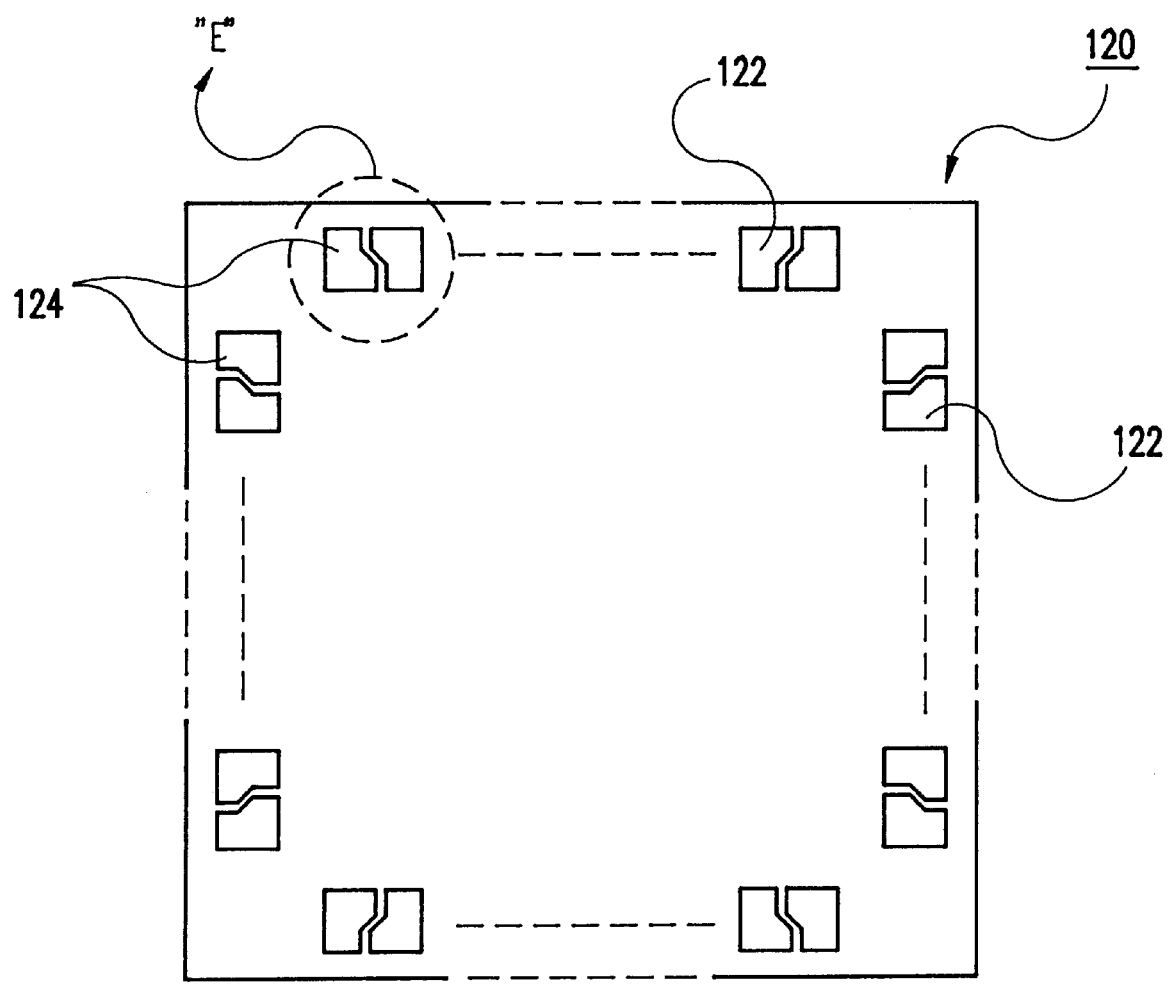
FIG. 13 is a plan view depicting the semiconductor chip according to a second embodiment of the present invention.
Figure 14:
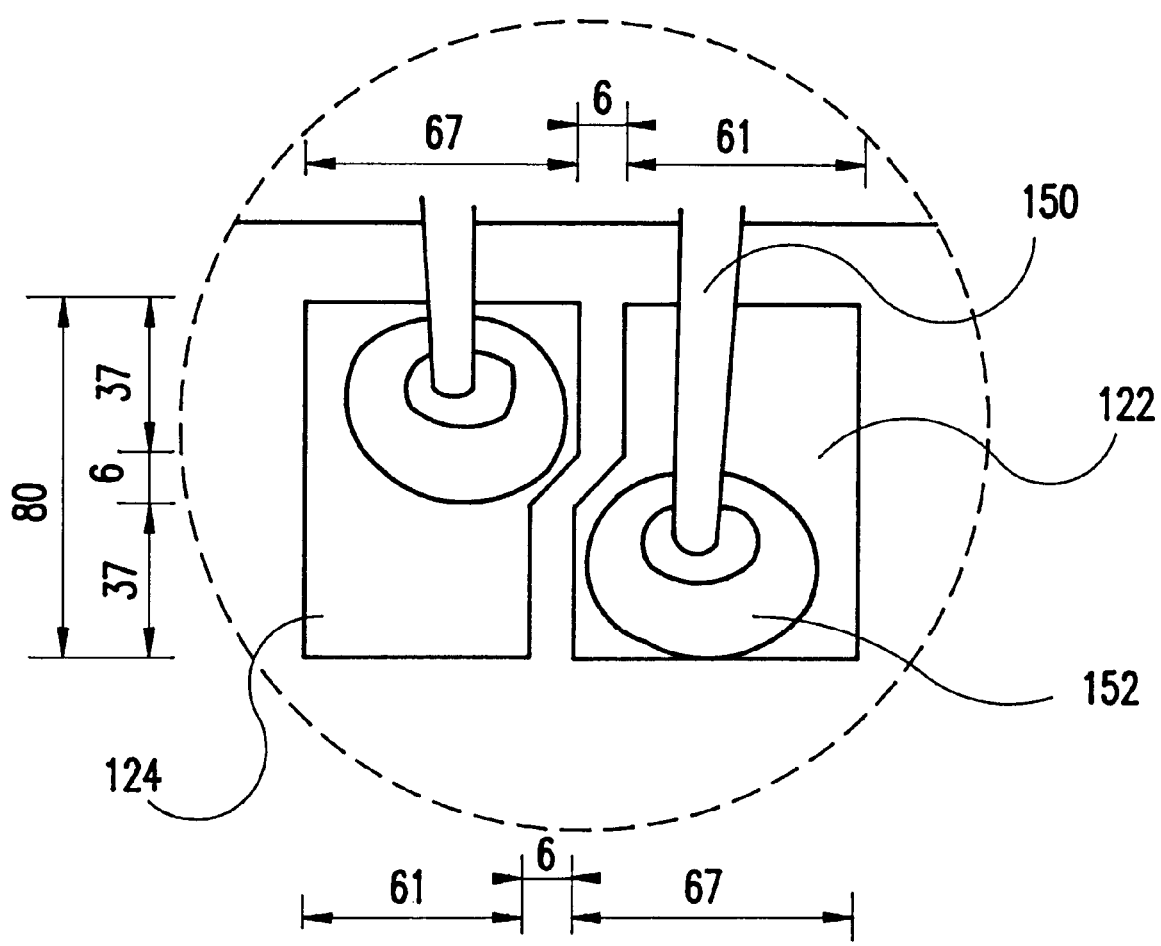
FIG. 14 is an enlarged plan view of the part 'E' in FIG. 13.

The second embodiment is described referring to FIG. 13 and FIG. 14. FIG. 13 is a plan view depicting the semiconductor chip according to a second embodiment of the present invention and FIG. 14 is an enlarged plan view of the part 'E' in FIG. 13.

In the second embodiment, interior bonding pads 122 and end bonding pads 124 are formed in a row along one edge of the semiconductor chip 120, and two neighboring pads 122, 124 or 122, 122 form a pair. For paired pads 122 and 124, or 122 and 122, their facing sides are formed so as to match to each other. For example, one of the paired pads may have its facing side extruding along half its length, from the outer side to a mid-length of the pad, while intruding along its remaining half, from the mid-length to the inner side of the pad. Extruding means that the width of the pad is greater than its average width, and intruding means the width of the pad is less than its average width. The extruding width is a width maximum and the intruding width is a width minimum. To keep the gap pitch constant, the other pad should have its facing side intruding from the outer side of the pad to the mid-length of the pad, while having its facing side extruding for the remaining half from the mid-length to the inner side of the pad. Thus, the two facing sides of the paired pads match.

For example, the width maximum distance and width minimum distance differ from the average width of a pad by 3 μm. This distance is a half of the gap pitch, 6 μm, between two interior bonding pads 112 or an interior bonding pad 112 and an end bonding pad 114 referred to in FIG. 12 for the first embodiment. This distance is also half of the gap pitch, 6 μm, between two interior bonding pads 122, or the interior bonding pad 122 and the end bonding pad 124 of the second embodiment. Stated another way, in this example the difference between the width minimum and the width maximum is one gap pitch distance or 6 μm. In this example, the width maximums of the bonding pads 122 and the end bonding pads 124 are each 67 μm, and the width minimums of the bonding pads 122 and the end bonding pads 124 are each 61 μm.

In the semiconductor chip 120 according to the second embodiment of the present invention, the structures of the other elements are the same as those of the semiconductor chip 110 of the first embodiment of the present invention. In a variation of the second embodiment, the extruding and intruding portions of the faces can deviate twice as far from the average width of the pad. That is, in this variation, the difference between the width minimum and the width maximum is twice the gap pitch distance.

When the small bumps are zigzagged, the second embodiment has all the advantages of the first embodiment, and more. The second embodiment has the additional advantages that each bump can vary farther from the center of the corresponding pad and not suffer insufficient bump shear strength, and the bump can vary more in size and not create a short by contacting the adjacent pad of the pair. Thus electrical defects are reduced more, even though the bumps 152 connecting the bonding wires 150 may be disposed closer to the adjacent pad of the pair.

Figure 15:
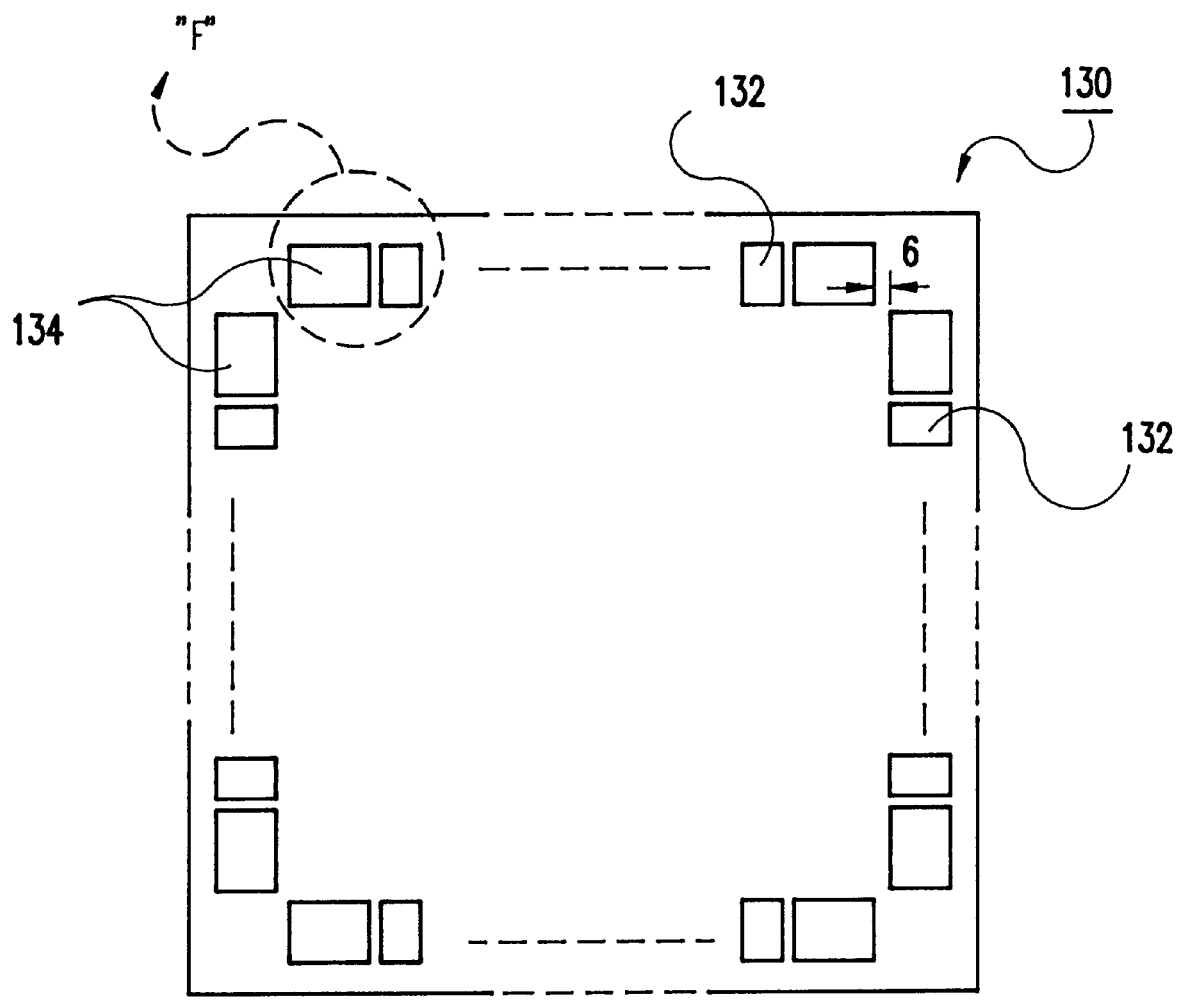
FIG. 15 is a plan view depicting the semiconductor chip according to a third embodiment of the present invention.
Figure 16:
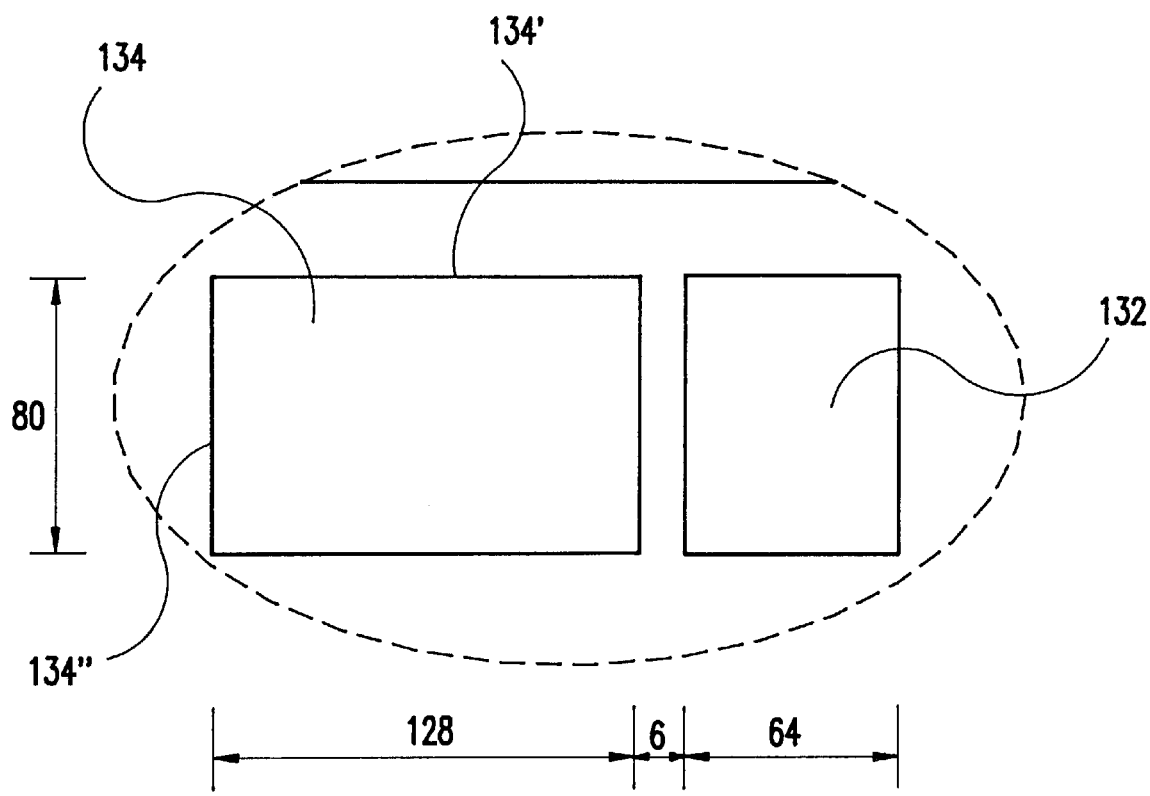
FIG. 16 is an enlarged plan view of the part 'F' in FIG. 15.

The third embodiment is described referring to FIG. 15 and FIG. 16. FIG. 15 is a plan view depicting the semiconductor chip according to a third embodiment of the resent invention and FIG. 16 is an enlarged plan view of the part 'F' in FIG. 15.

In the third embodiment, the semiconductor chip 130 has a structure in which the width distance 134' of each end bonding pad 134 is twice the width distance of the interior bonding pad 132. The structures of the other elements are the same as those of the semiconductor chip 110 of the first embodiment. For example, the area of each end bonding pad 134 is 128 μm * 80 μm, and the area of each interior bonding pad 132 is 64 μm * 80 μm.

The third embodiment has all the advantages of the first embodiment, and further it has the additional advantage that the bonding reliability is increased for the end bonding pads where the tolerances of the bonding wire equipment are accumulated to accommodate the greatest deviation of a bump from its accurate placement on a bonding pad.

Figure 17:
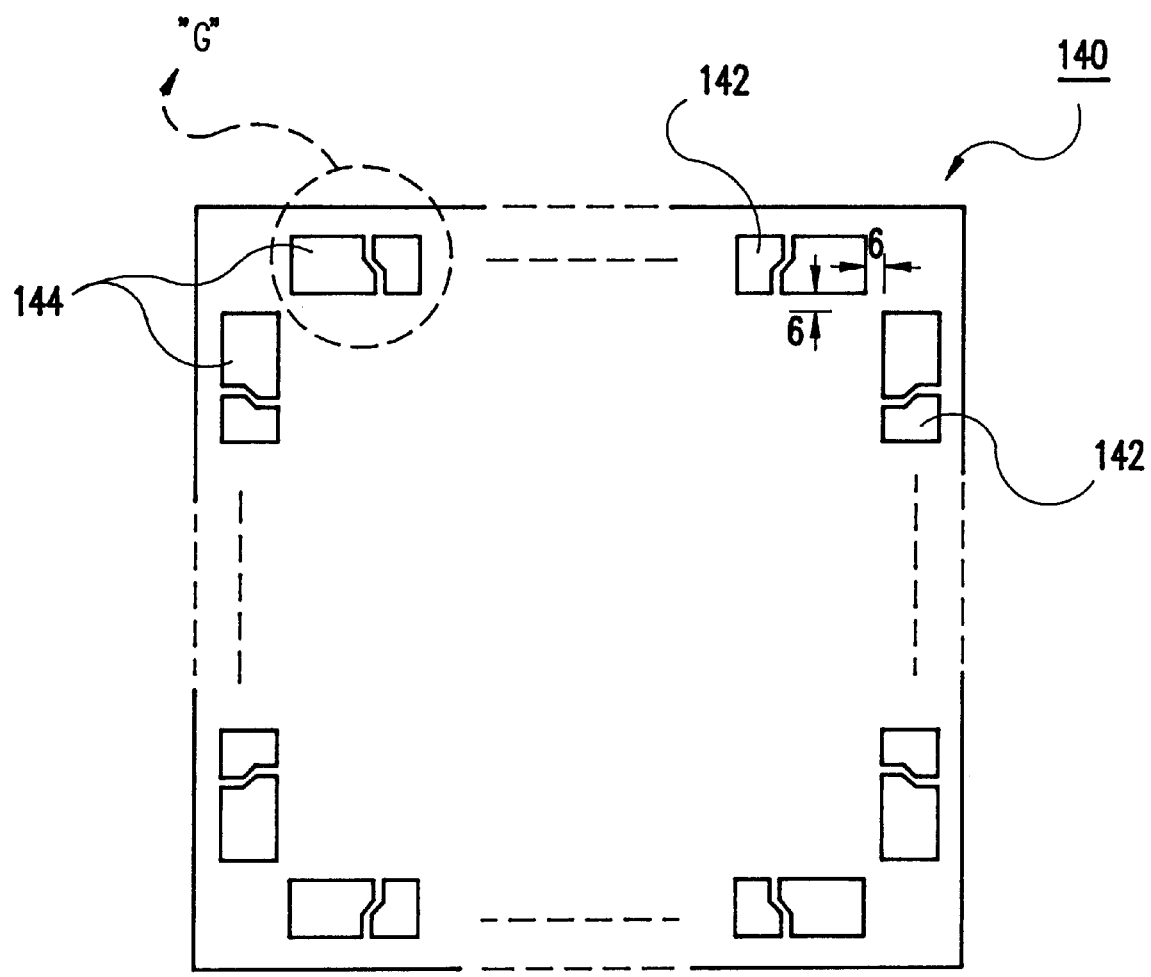
FIG. 17 is a plan view depicting the semiconductor chip according to a fourth embodiment of the present invention.
Figure 18:
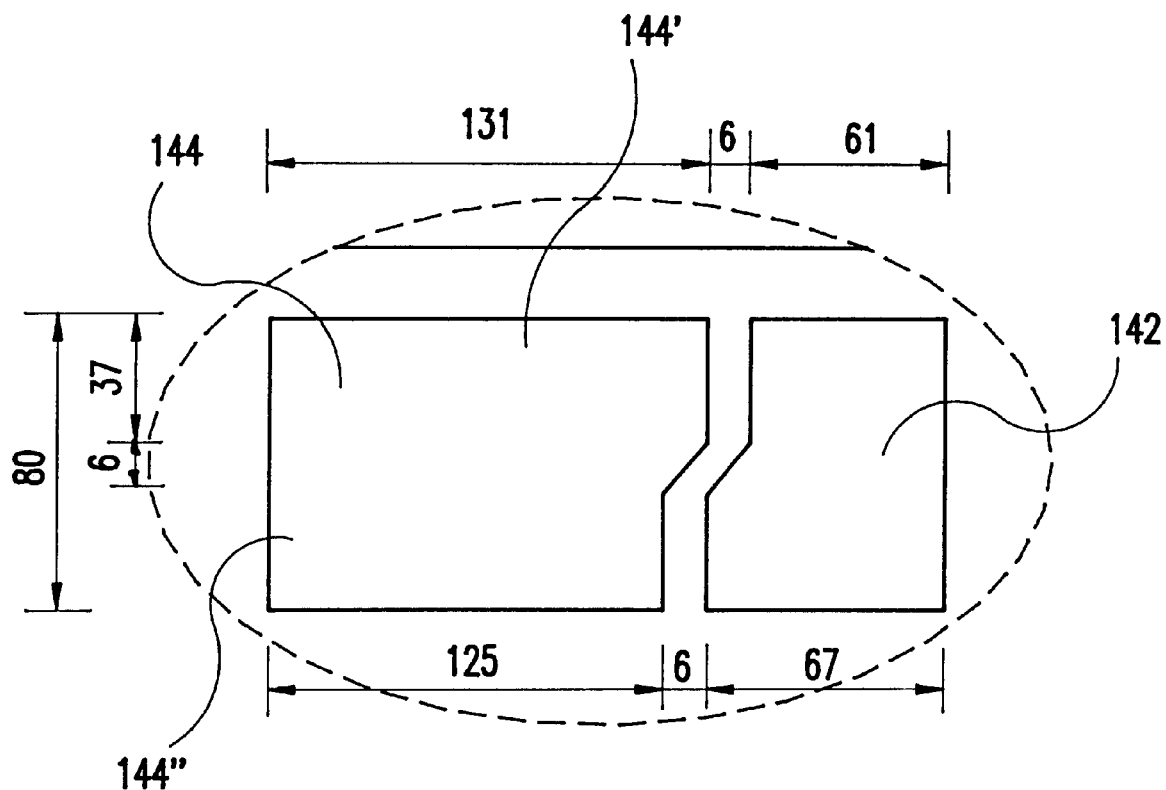
FIG. 18 is an enlarged plan view of the part 'G' in FIG. 17.

The fourth embodiment is described referring to FIG. 17 and FIG. 18. FIG. 17 is a plan view depicting the semiconductor chip according to fourth embodiment of the present invention and FIG. 18 is an enlarged plan view of the part 'G' in FIG. 17.

In the fourth embodiment, the semiconductor chip 140 has a structure in which the average end width is twice the average interior width. The difference between the end width maximum and the end width minimum is the same as the difference between the interior width maximum and the interior width minimum. That difference is either one gap pitch distance as in the second embodiment, or two gap pitch distances as in the variation of the second embodiment. The structures of the interior pads in the fourth embodiment are the same as those of the semiconductor chip 120 of the second embodiment.

For example, the end width maximum distance 144' of each end pad 144 is 131 μm, and the end width minimum distance of each end bonding pad 144 is 125 μm. The interior width maximum distance and the interior width minimum distance of each of the interior bonding pads 142 are the same as that of the second embodiment.

The fourth embodiment has all the advantages of the second embodiment, and further it has the additional advantage that the bonding reliability is increased for the end bonding pads where the tolerances of the bonding wire equipment are accumulated to accommodate the greatest deviation of a bump from its accurate placement on a bonding pad. Therefore, the fourth embodiment is the preferred embodiment of the present invention.

Figure 19:
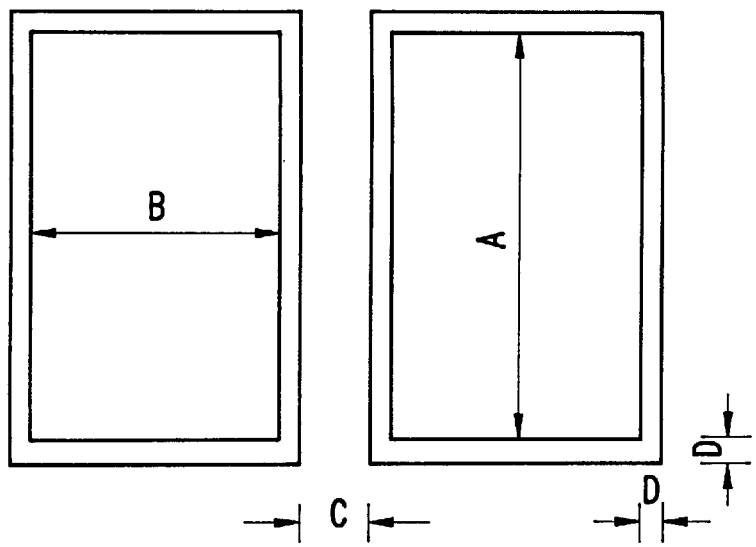
FIG. 19 is a schematic view depicting the dimension of the interior bonding pad of a semiconductor chip according to other examples of the present invention.
Figure 20:
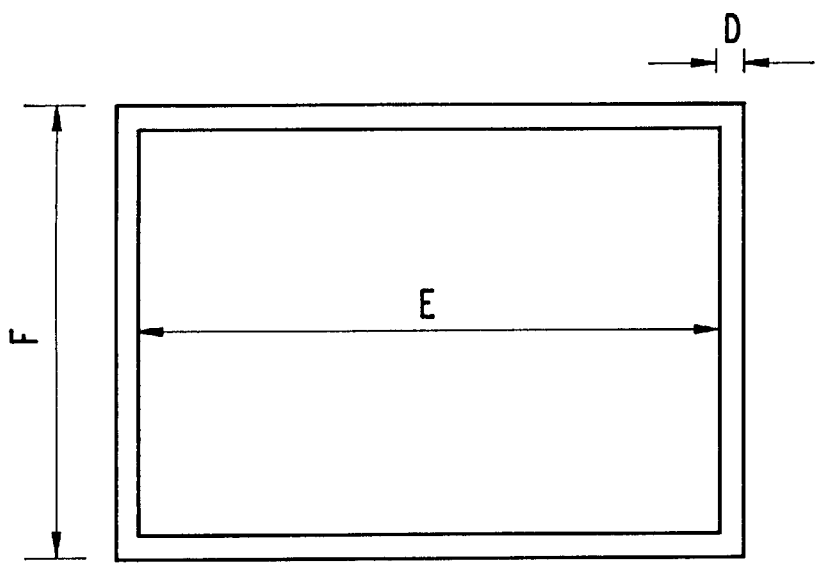
FIG. 20 is a schematic view depicting the dimension of the end bonding pad of a semiconductor chip according to the same examples of the present invention as in FIG. 19.

Design variations have been worked out for the third embodiment and are described with reference to FIG. 19, FIG. 20, and Table 1. FIG. 19 and FIG. 20 are schematic views for demonstrating the dimension for design elements of the bonding pads of a semiconductor chip according to examples within the third embodiment. Table 1 represents the dimension of the bonding pad in which the total pitch between the bonding pads varies from 70 μm to 150 μm. A, B, C, E, and F are minima and D is a maximum. They are defined as follows:

A is the length distance, perpendicular to the chip's edge, of the exposed area of any bonding pad;

B is the width distance, parallel to the chip's edge, of the exposed area of an interior bonding pad;

C is the gap pitch between the bonding pads;

D is the distance from each side of a bonding pad that is covered by the passivation layer formed on the upper surface of the bonding pad;

E is the width distance, parallel to the chip's edge, of the exposed area of an end bonding pad; and F is the length distance, perpendicular to the chip's edge, of any bonding pad.

TABLE 1

Design Variations of the Present Invention Depending on Total Pitch.

| | \multicolumn{7}{c}{Total pitch between bonding pads} |
|---|---|---|---|---|---|---|---|
| | 150 | 125 | 100 | 90 | 80 | 75 | 70 |
| A | 125 | 125 | 100 | 90 | 80 | 75 | 70 |
| B | 90 | 90 | 84 | 74 | 64 | 59 | 54 |
| C | 50 | 25 | 6 | 6 | 6 | 6 | 6 |
| D | 5 | 5 | 5 | 5 | 5 | 5 | 5 |
| E | 208 | 208 | 184 | 164 | 144 | 134 | 128 |
| F | 135 | 135 | 110 | 100 | 90 | 85 | 80 |

The preferred embodiment and other embodiments of the present invention have been described in detail. It will be apparent to those skilled in the art that various modifications and variations can be made in the semiconductor chip with shaped bonding pads of the present invention without departing from the spirit or scope of the invention. Thus, it is intended that the present invention cover the modifications and variations of this invention provided they come within the scope of the appended claims and their equivalents.

What is claimed is:

1. A semiconductor chip, comprising:

a plurality of interior bonding pads formed in a row along an edge of the chip and spaced at a designated gap pitch distance between confronting sides of adjacent pads;

one or more end bonding pads formed at each end of the row along an edge of the chip and spaced at the designated gap pitch distance between confronting sides of adjacent interior bonding pads, wherein each of the interior and end bonding pads has a length perpendicular to the edge of the chip, the length having a length distance, wherein each of the interior bonding pads has an interior width parallel to the edge of the chip, the interior width having an interior width distance, wherein each of the end bonding pads has an end width parallel to the edge of the chip, the end width having an end width distance, wherein the length distance is different from both the end width distance and the interior width distance, and wherein the end width distance is greater than the interior width distance.

2. A semiconductor chip, comprising:

a plurality of interior bonding pads formed in a row along an edge of the chip and spaced at a designated gap pitch distance between confronting sides of adjacent pads;

one or more end bonding pads formed at each end of the row along an edge of the chip and spaced at the designated gap pitch distance between confronting sides of adjacent interior bonding pads, wherein each of the interior and end bonding pads has a length perpendicular to the edge of the chip, the length having a length distance, wherein each of the interior bonding pads has an actual interior width parallel to the edge of the chip, the total interior width having an actual interior width distance, wherein each of the end bonding pads has an actual end width parallel to the edge of the chip, the total end width having an actual end width distance, wherein the length distance is different from both the end width distance and the interior width distance, wherein the total end width distance is variable and each end pad has a plurality of intermediate end width distances in the range from an end width minimum to an end width maximum, and wherein the interior width distance is variable and each of the interior pads has a plurality of intermediate interior width distances in the range from an interior width minimum to an interior width maximum.

3. The semiconductor chip of claim 2, wherein each of the interior and end bonding pads has an outer side closest to the edge of the chip, an inner side farthest from the edge of the chip, a width minimum, wherein the width minimum is equal to the end width minimum if the pad is one of the end bonding pads, and wherein the width minimum is equal to the interior width minimum if the pad is one of the interior bonding pads, a width maximum, wherein the width maximum is equal to the end width maximum if the pad is one of the end bonding pads, and wherein the width maximum is equal to the interior width maximum if the pad is one of the interior bonding pads, a mid-length that is half way between the inner side and the outer side, wherein an outer width of each pad is substantially constant from the outer side to about the mid-length and an inner width of each pad is substantially constant from the inner side to about the mid length, whereby a change in width from the width minimum to the width maximum occurs in close proximity to the mid-length, wherein a widening pad has a width equal to the width minimum at the outer side and a width equal to the width maximum at the inner side, and wherein a narrowing pad has a width equal to the width maximum at the outer side and a width equal to the width minimum at the inner side, wherein widening pads alternate with narrowing pads along the row of pads, and a pair of pads has one widening pad and a single adjacent narrowing pad, and wherein a non-facing side of each of the pads from the pair is substantially perpendicular to the edge of the chip and to the inner side and to the outer side.

4. The semiconductor chip of claim 3, wherein the end width minimum equals the interior width minimum, and the end width maximum equals the interior width maximum.

5. The semiconductor chip of claim 3, wherein an end average width of the end width minimum and the end width maximum is greater than an interior average width of the interior width minimum and the interior width maximum.

6. The semiconductor chip of claim 3, wherein the interior width maximum is equal to the interior width minimum plus the gap pitch distance, and the end width maximum is equal to the end width minimum plus the gap pitch distance.

7. The semiconductor chip of claim 6, wherein
the end width minimum is equal to the interior width minimum.

8. The semiconductor chip of claim 6, wherein an end average width of the end width minimum and the end width maximum is greater than an interior average width of the interior width minimum and the interior width maximum.

9. The semiconductor chip of claim 3, wherein
the interior width maximum is equal to the interior width minimum plus twice the gap pitch distance, and
the end width maximum is equal to the end width minimum plus twice the gap pitch distance.

10. The semiconductor chip of claim 9, wherein
the end width minimum is equal to the interior width minimum.

11. The semiconductor chip of claim 9, wherein an end average width of the end width minimum and the end width maximum is greater than an interior average width of the interior width minimum and the interior width maximum.

* * * * *